United States Patent
Azuma et al.

(10) Patent No.: US 7,704,795 B2
(45) Date of Patent: Apr. 27, 2010

(54) DISPLAY DEVICE AND MANUFACTURING METHOD THEREOF

(75) Inventors: Hitoshi Azuma, Yokohama (JP);
Masahiro Tanaka, Chiba (JP);
Toshiyuki Matsuura, Mobara (JP)

(73) Assignee: Hitachi Displays, Ltd., Chiba (JP)

( * ) Notice: Subject to any disclaimer, the term of this patent is extended or adjusted under 35 U.S.C. 154(b) by 306 days.

(21) Appl. No.: 11/892,503

(22) Filed: Aug. 23, 2007

(65) Prior Publication Data
US 2008/0048347 A1    Feb. 28, 2008

(30) Foreign Application Priority Data
Aug. 25, 2006   (JP)   ................. 2006-228981

(51) Int. Cl.
*H01L 21/00* (2006.01)
(52) U.S. Cl. .................. 438/113; 257/E21.7
(58) Field of Classification Search ............ 438/113
See application file for complete search history.

(56) References Cited

U.S. PATENT DOCUMENTS
2008/0246036 A1*  10/2008  Yamazaki et al. ............. 257/72

FOREIGN PATENT DOCUMENTS
JP    2005-164798    12/2003

* cited by examiner

*Primary Examiner*—Evan Pert
(74) *Attorney, Agent, or Firm*—Stites & Harbison PLLC; Juan Carlos A. Marquez, Esq.

(57) ABSTRACT

The present invention provides a manufacturing method of a display device which can efficiently separate individual thin-thickness display devices from a large-sized mother substrate. Scribe marks for separating a plurality of display devices are preliminarily formed on back surfaces of a TFT mother substrate and a sealing mother substrate. By etching front surfaces of these mother substrates, etching portions reach the scribe marks so that a plurality of display devices each of which is constituted of a TFT substrate and a sealing substrate can be separated from each other.

1 Claim, 5 Drawing Sheets

DISPLAY DEVICE AND MANUFACTURING METHOD THEREOF

CROSS-REFERENCE TO RELATED APPLICATIONS

The disclosure of Japanese Patent Application No. P2006-228981 filed on 2006 Aug. 25 including the claims, the specification, the drawings and the abstract is incorporated herein by reference in its entirety.

BACKGROUND

1. Field of the Invention

The present invention relates to a display device which is separated from a large-sized mother substrate on which a plurality of display devices is formed and a manufacturing method which manufactures individual display devices by separating these display devices.

2. Description of the Related Art

With respect to various display devices, particularly, an organic EL display device is extremely advantageous due to self-luminous light thereof and can facilitate the reduction of thickness and the reduction of weight of the display device. However, the reduction of thickness is limited due to the restriction imposed on a production process.

Under a current manufacturing process of the display device, thin film transistor (TFT) circuits are formed on the large-sized mother substrate, organic EL elements which constitute display elements are formed on the large-sized mother substrate and, thereafter, a sealing mother substrate is made to overlap this TFT mother substrate. Then, the above-mentioned steps are followed by steps in which the TFT mother substrate and the sealing mother substrate which are made of glass are made thin by etching and, thereafter, the TFT mother substrate and the sealing mother substrate are cut into a size of the display device. In such a cutting step, the thicknesses of the TFT mother substrate and the sealing mother substrate which enable cutting of these mother substrates are limited and hence, in the etching step which is a preceding step of the cutting step, currently, it is difficult to reduce the thicknesses of the sealing mother substrate and the TFT mother substrate equal to or more than the cutting allowable thicknesses.

Following patent document 1 discloses a manufacturing method of a display panel which manufactures the display panel by adhering a TFT mother substrate and a counter mother substrate to each other, by forming division grooves in the TFT mother substrate and the counter mother substrate by etching, by reducing the thicknesses of the TFT mother substrate and the counter mother substrate with further etching, and by dividing these substrates into individual display panels along division grooves.

[Patent Document 1] JP-A-2005-164798

SUMMARY

In the above-mentioned patent document 1, the division grooves are formed on the surface of the mother substrate and these division grooves are formed by etching using a mask for etching. Accordingly, a mask step for etching is necessary.

Accordingly, it is an object of the present invention to provide a manufacturing method of a display device which is characterized by preliminarily forming scribe marks for separating individual display devices on a back surface of at least one substrate of a first glass substrate (a TFT mother substrate) and a second glass substrate (a sealing mother substrate), by adhering these substrates to each other in an overlapped manner in a state that the scribe marks face a back surface of another substrate, and by etching a front surface of at least one substrate thus separating these substrates into the individual display devices.

According to the present invention, it is possible to facilitate the reduction of thickness and the reduction of weight of a display device and, at the same time, to reduce the number of steps and to reduce a cost by simultaneously performing etching and cutting.

Further, it is possible to eliminate the restriction imposed on cutting of a thin plate which has been a drawback at the time of cutting out display devices from a large-sized mother substrate thus realizing the mass production of thinner display devices.

DESCRIPTION OF THE PREFERRED EMBODIMENTS

Hereinafter, embodiments of the present invention are explained in conjunction with drawings.

Embodiment 1

Figure 1A:
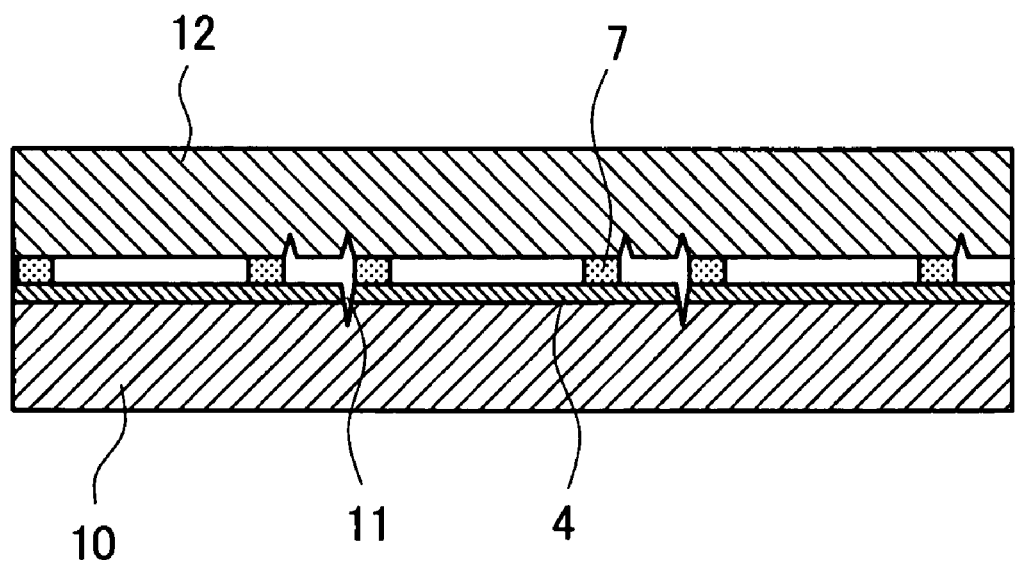
FIG. 1A and FIG. 1B are cross-sectional views of mother substrates before and after etching.
Figure 1B:
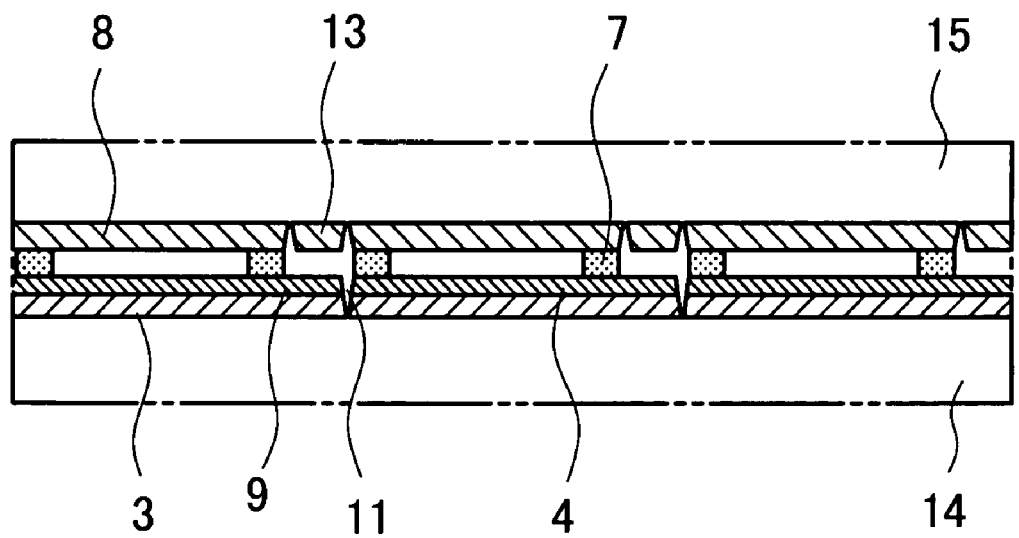

FIG. 1A and FIG. 1B are cross-sectional views of mother substrates on which a plurality of display devices is formed, wherein FIG. 1A shows the mother substrates before etching and FIG. 1B shows the mother substrates after etching.

In FIG. 1A, to a TFT mother substrate 10 on which thin film transistor (TFT) circuit layers 4 which drive organic ELs, liquid crystal and the like as display elements are formed, a sealing mother substrate 12 is adhered in an opposedly facing manner using an adhesive layer 7. On back surfaces of the TFT mother substrate 10 and the sealing mother substrate 12, scribe marks 11 for separating the TFT mother substrate 10 and the sealing mother substrate 12 into a plurality of display devices are preliminarily formed. These substrates are made of alkali-free glass.

In FIG. 1B, front surfaces of the TFT mother substrate 10 and the sealing mother substrate 12 are etched, and etching portions 14, 15 reach the scribe marks 11 and hence, the individual display devices are separated. The separated display device is constituted of a TFT substrate 3 on which a TFT circuit layer 4 is formed and a sealing substrate 8 which is adhered to the TFT substrate 3 in an opposedly facing manner using an adhesive layer 7. Here, a cut end material 13 on a terminal portion 9 for driving a TFT is discarded.

Figure 2:
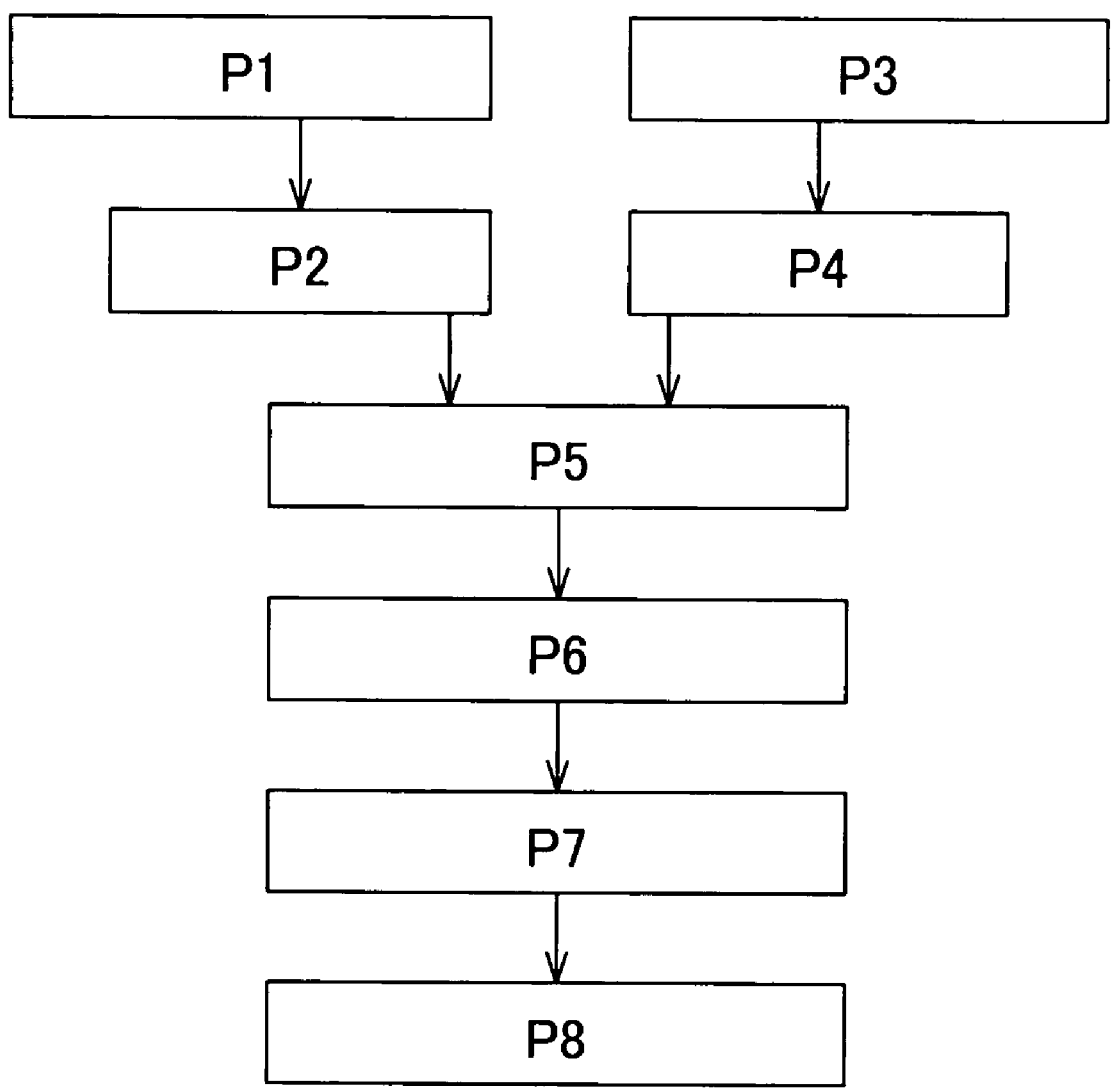
FIG. 2 is a manufacturing process of a plurality of display devices.

FIG. 2 shows a manufacturing process of a plurality of display devices. In FIG. 2, first of all, the TFT mother substrate and the sealing mother substrate are prepared and, thereafter, scribe lines are mechanically drawn on back surfaces of these substrates to form scribe marks. These processes are indicated as P1 and P2 in FIG. 2.

Figure 3:
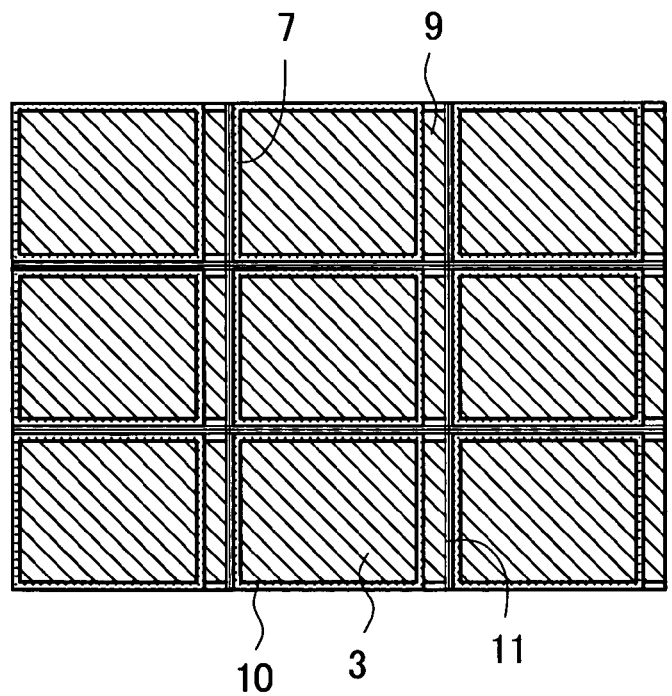
FIG. 3 is a plan view of a back surface of a TFT mother substrate.

FIG. 3 is a plan view of the back surface of the TFT mother substrate 10 and shows a state in which the scribe marks are formed by drawing the scribe lines 11 on the back surface of the TFT mother substrate 10. The scribe lines 11 are drawn for dividing the TFT mother substrate 10 into a plurality of (for example, 3×3=9) display devices formed in a matrix array. This process is indicated as P3 in FIG. 2.

Figure 4:
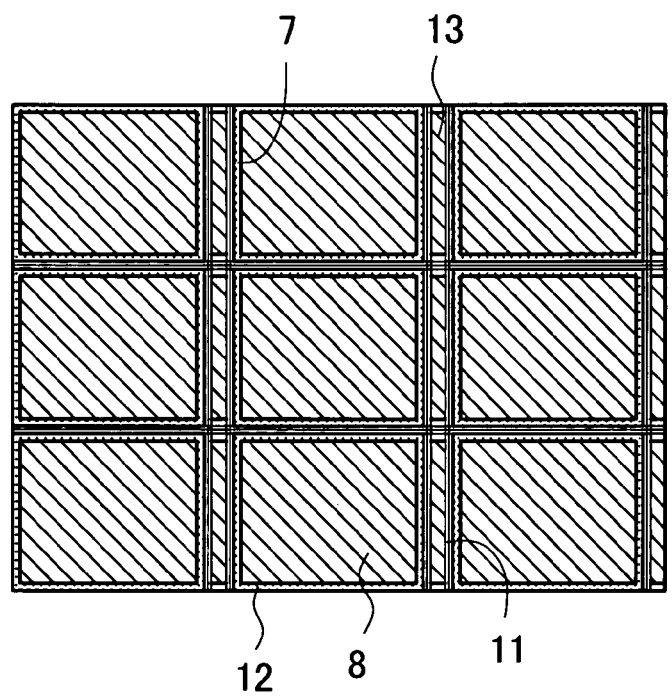
FIG. 4 is a plan view of a back surface of a sealing mother substrate.

FIG. 4 is a plan view of the back surface of the sealing mother substrate 12 and shows a state in which the scribe marks are formed by drawing the scribe lines 11 on the back surface of the sealing mother substrate 12. The scribe lines 11 are drawn for dividing the sealing mother substrate 12 into the plurality of display devices formed in a matrix array and, at the same time, for dividing cut end materials 13. This process is indicated as P4 in FIG. 2. Here, in FIG. 3 and FIG. 4, an adhesive layer 7 may be formed on either one of the TFT mother substrate 10 and the sealing mother substrate 12.

Then, an adhesive agent is applied to either one of the TFT mother substrate 10 shown in FIG. 3 and the sealing mother substrate 12 shown in FIG. 4 and, thereafter, the TFT mother substrate 10 and the sealing mother substrate 12 are made to overlap each other in a state that the back surfaces of these substrates face each other in an opposed manner. This state is the state before etching shown in FIG. 1A. The adhesive layer 7 shown in FIG. 1A may be made of a material which is not damaged by an etchant, or barrier film (not shown in the drawing) may be formed on portions which are exposed to an etchant. This process is indicated as P5 in FIG. 2.

A front surface of the TFT mother substrate and the sealing mother substrate are etched in a thickness direction from such a state. As shown in FIG. 1B, when the etching portions 14, 15 reaches the scribe marks 11, the plurality of display devices and the cut end materials 13 are respectively separated (broken). This process is indicated as P6 in FIG. 2. After breaking, when necessary, a reinforcing plate is adhered to the display device, and an adhesive agent is applied to side surfaces of the display device. These processes are indicated as P7 and P8 in FIG. 2.

Figure 5:
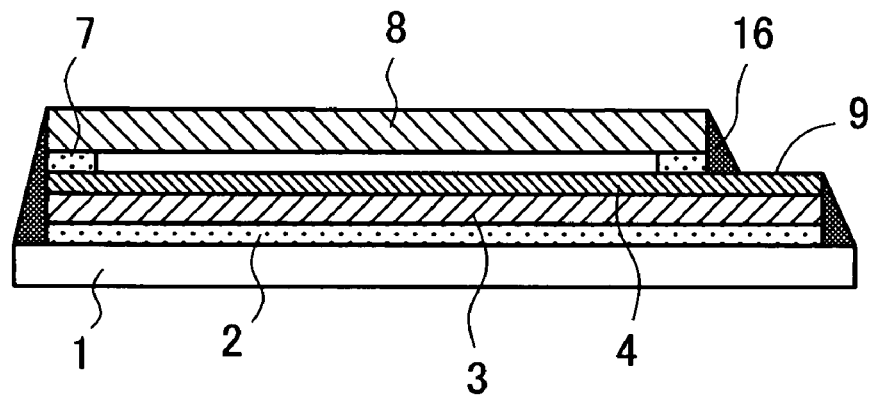
FIG. 5 is a cross-sectional view of a display device to which a reinforcing plate is adhered.
Figure 6:
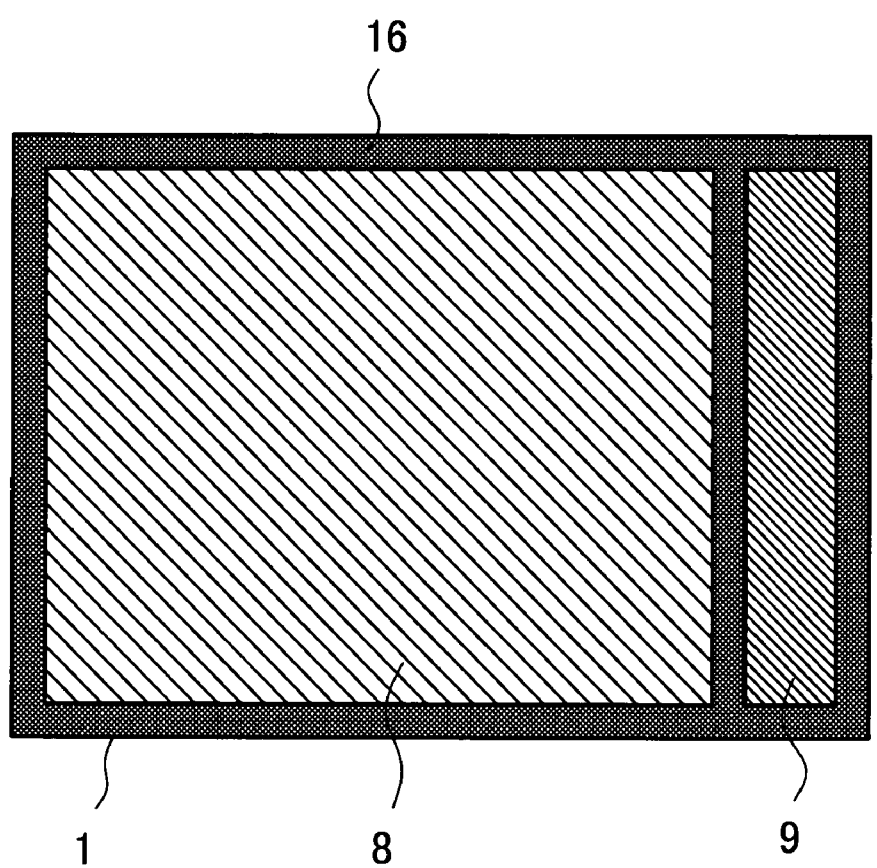
FIG. 6 is a plan view of the display device shown in FIG. 5.

FIG. 5 is a cross-sectional view of the display device to which the reinforcing plate is adhered. FIG. 6 is a plan view of such a display device. As shown in FIG. 5 and FIG. 6, the reinforcing plate 1 has a size slightly larger than a size of the TFT substrate 3, and is adhered to the TFT substrate 3 by means of an adhesive layer 2. A side-surface adhesive agent 16 is formed on peripheries of the TFT substrate 3 and the sealing substrate 8.

In this embodiment, the explanation has been made with respect to the method which simultaneously etches the TFT mother substrate and the sealing mother substrate. However, as will be explained hereinafter, similar advantageous effects can be obtained by a method which etches the TFT mother substrate and the sealing mother substrate individually.

Embodiment 2

Figure 7:
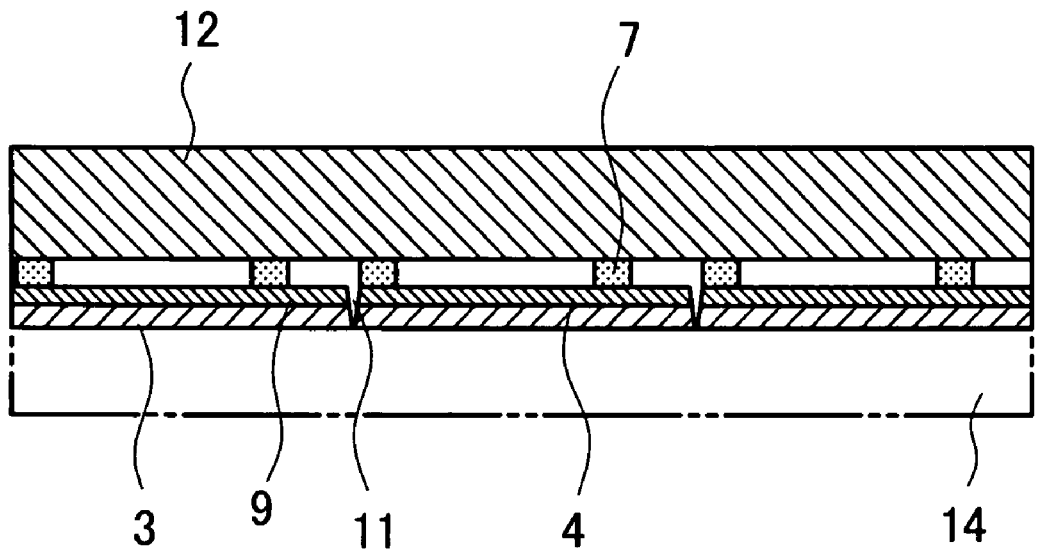
FIG. 7 is a cross-sectional view of the mother substrate when only the TFT mother substrate is etched.
Figure 8:
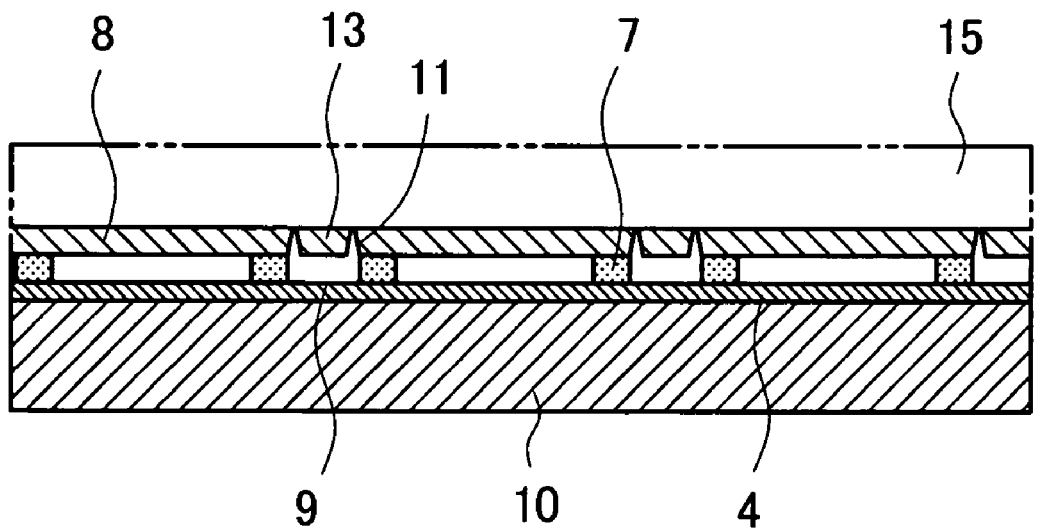
FIG. 8 is a cross-sectional view of the mother substrate when only the sealing mother substrate is etched.

FIG. 7 is a cross-sectional view of the mother substrate when only the TFT mother substrate is etched. FIG. 8 is a cross-sectional view of the mother substrate when only the sealing mother substrate is etched.

In FIG. 7, when only the TFT mother substrate is etched as indicated by the etching portion 14, the sealing mother substrate 12 is mechanically broken. In this case, as shown in FIG. 1A, the scribe marks may be preliminarily formed on the back surface of the sealing mother substrate 12 or the scribe marks may be formed on the front surface of the sealing mother substrate 12.

In FIG. 8, when only the sealing mother substrate is etched as indicated by the etching portion 15, the TFT mother substrate 10 is mechanically broken in the same manner. In this case, as shown in FIG. 1A, the scribe marks may be preliminarily formed on the back surface of the TFT mother substrate 10 or the scribe marks may be formed on the front surface of the TFT mother substrate 10.

What is claimed is:

1. A method of manufacturing a display device, the method comprising:

providing a first substrate and a second substrate;

forming scribe marks on a first surface of at least one of the first and second substrates;

adhering the first and second substrates to each other in a state that the scribe marks are sandwiched between the first and second substrates; and etching an outer surface of the at least one of the first and second substrates that is opposite the first surface to thin the at least one of the first and second substrates and separate the at least one of the first and second substrate at the scribe marks.

* * * * *